(12) United States Patent
Onuma

(10) Patent No.: US 6,380,071 B1
(45) Date of Patent: Apr. 30, 2002

(54) METHOD OF FABRICATING SEMICONDUCTOR DEVICE

(75) Inventor: Takuji Onuma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/616,774

(22) Filed: Jul. 14, 2000

(30) Foreign Application Priority Data

Jul. 14, 1999 (JP) ............................................ 11-200129

(51) Int. Cl.[7] .......................................... H01L 21/4763
(52) U.S. Cl. ........................ 438/634; 438/622; 438/624; 438/633; 438/637; 438/672; 257/760; 257/774
(58) Field of Search ................................. 438/622, 629, 438/624, 633, 637, 672, 675, 692, 618; 257/760, 774

(56) References Cited

U.S. PATENT DOCUMENTS 6,020,258 A * 2/2000 Yew et al. ................... 438/634

FOREIGN PATENT DOCUMENTS

| JP | 4-74430 | 3/1992 |
| JP | 08153796 A | 6/1996 |

* cited by examiner

Primary Examiner—Charles Bowers
Assistant Examiner—Hsien Ming Lee
(74) Attorney, Agent, or Firm—Scully, Scott, Murphy & Presser

(57) ABSTRACT

A method of fabricating a semiconductor device, which forms dielectric sidewalls reliably at each side of a first wiring structure to protect its conductive line in the etching process for forming a via hole in an interlayer dielectric layer to cover the first wiring structure. In this method, the first wiring structure is formed on a first dielectric layer. A second dielectric layer is formed on the first dielectric layer to cover the first wiring structure. A third dielectric layer serving as an interlayer dielectric layer is formed on the second dielectric layer. The third and second dielectric layers are polished using the CMP technique until the dielectric of the first wiring structure is exposed, thereby leaving part of the second dielectric layer that extends along each side of the first wiring structure and the surface of the first dielectric layer. The dielectric layer is etched using a mask to form a via hole. The hole is then filled with a conductive plug. A second wiring structure is formed on the remaining third dielectric layer in such a way that the second wiring structure is electrically connected to the first wiring structure through the plug. The second dielectric layer is less in polishing rate than the third dielectric layer in the CMP process. The second dielectric layer is less in etching rate than the dielectric of the first wiring structure in the etching process for the via hole.

6 Claims, 8 Drawing Sheets

METHOD OF FABRICATING SEMICONDUCTOR DEVICE

BACKGROUND OF THE INVENTION

1. Field of the Invention

The present invention relates to a method of fabricating a semiconductor device and more particularly, to a method of fabricating a semiconductor device that makes it possible to form via holes or contact holes in an interlevel dielectric layer in self-alignment with corresponding conductors.

2. Description of the Related Art

Recently, the integration level of Large-Scale Integrated Circuits (LSIs) has been increasing and as a result, there has been the strong need to decrease not only the size of electronic elements such as transistors to be integrated on a semiconductor substrate but also the pitch of conductive lines in each wiring layer. Thus, on designing the layout of via holes or contact holes, which are used for electrically interconnecting the conductive lines in a wiring layer with the conductive lines in an overlying wiring layer, the alignment margin of the via or contact holes has become necessary to be determined to be equal to or less than the alignment accuracy of a specific LSI fabrication system.

For example, the layout of a square via hole 152 and a conductive line 151 as shown in FIG. 1 is considered. In this case, the via hole 152 is located to entirely overlap with the vicinity of an end of the conductive line 151 in such a way that two widthwise edges 151a and 151b of the line 151 are respectively apart from corresponding or opposing edges 152a and 152b of the hole 152 at equal distances (i.e., an alignment margin) M. If the LSI fabrication system to be used has an alignment accuracy A, the alignment margin M needs to be adjusted to be equal to or less than the accuracy A, i.e., M≦A.

In the explanation presented below, the term "via hole" means not only a via hole but a contact hole.

If the margin M is set to be equal to or less than the accuracy A, however, part of the hole 152 tends to deviate from the line 151 due to accumulation of alignment errors in the actual fabrication processes. This is explained in detail below with reference to FIG. 2.

In FIG. 2, a thin dielectric layer 161a is formed on the surface of a semiconductor substrate 161 and then, the conductive line 151 is formed on the layer 161a. A thick interlayer dielectric layer 162 is formed on the layer 161a to cover the line 151. The layer 162 has the via hole 152 that penetrates vertically the layer 162 to the line 151. Needless to say, the layout design is conducted in such a way that the hole 152 is located at the widthwise center of the line 151, as shown in FIG. 1. However, actually, the hole 152 is largely deviated from the desired or designed position due to accumulation of alignment or overlying errors among patterned masks, resulting in deviation of part of the hole 152 from the line 151, as shown in FIG. 2. In this state, as seen from FIG. 2, the upper corner and the side face of the line 151 and the dielectric layer 161a are exposed to the hole 152.

Typically, the via hole 152 is formed by selectively removing the interlayer dielectric layer 162 using a patterned resist film (not shown) in a dry etching process. Thus, if the hole 152 is deviated from the desired position, as shown in FIG. 2, not only the top surface of the line 151 but also the upper corner and side face thereof are contacted with the etching gas in the dry etching process of the layer 162 for forming the hole 152. This means that the line 151 is excessively etched in the dry etching process compared with the calculated etching amount of the line 151, thereby producing a lot of etch residues that are unable or difficult to be entirely removed. As a consequence, there arises a problem that the yield of the etching process for forming the via hole 152 is lowered. Also, since the upper corner of the line 151 is waned or cut during the etching process, there arises another problem that the electrical resistance of the resultant line 151 is higher than the desired value.

To avoid these problems, conventionally, various methods of forming the via hole 152 in self-alignment to the conductive line 151 have been developed and disclosed. One of the methods is explained below with reference to FIGS. 3A to 3D, which is disclosed in the Japanese Non-Examined Patent Publication No. 8-153796 published in June 1996.

First, as shown in FIG. 3A, a thin dielectric layer 121a is formed on the surface of a semiconductor substrate 121 that contains necessary electronic elements such as transistors therein. Next, a conductive layer (not shown) and a silicon dioxide ($SiO_2$) layer (not shown) are successively formed on the layer 121a. These two layers are then patterned using the same resist mask, forming a conductive line 122 and a $SiO_2$ protection layer 123 located on the line 122. The line 122 and the layer 123 constitute a lower wiring structure 130. The state at this stage is shown in FIG. 3A.

Subsequently, a silicon oxynitride (SiON) layer (not shown) is formed on the dielectric layer 121a over the whole substrate 121 and is etched back, forming a pair of SiON sidewalls 124a and 124b on the layer 121a at each side of the lower wiring structure 130, as shown in FIG. 3B.

A thick $SiO_2$ layer 125 is formed on the dielectric layer 121a over the whole substrate 121 as an interlayer dielectric layer, as shown in FIG. 3C. The surface of the layer 125 is planarized and then, selectively removed in a dry etching process using a resist mask, thereby forming a via hole 127 to penetrate the layer 125 at a specific location. Since the $SiO_2$ protection layer 123 of the wiring structure 130 is removed in this dry etching process, the top surface of the conductive line 122 is exposed within the hole 127. The state at this stage is shown in FIG. 3C.

The etch rate of SiON is sufficiently lower than that of $SiO_2$ in the dry etching process for the $SiO_2$ interlayer dielectric layer 125 and therefore, the SiON sidewalls 124a and 124b are left substantially unetched. Thus, even if the via hole 127 is laterally shifted from its desired position along the surface of the substrate 121 and part of the hole 127 deviates from the conductive line 122 due to accumulation of alignment errors among patterned masks in the actual fabrication processes, the upper corner and the side face of the line 122 is protected by the sidewalls 124a and 124b not to be contacted with the etching gas. As a result, the above-described two problems that the yield of the etching process for forming the via hole 127 is lowered and that the electrical resistance of the resultant line 122 is higher than the desired value can be avoided.

Thereafter, as shown in FIG. 3D, the via hole 127 of the interlayer dielectric layer 125 is filled with a tungsten (W) plug 123 by a known method. An upperwiring structure 131 with a specific pattern is formed on the layer 125. The plug 123 is contacted with a conductive line 126 of the structure 131. In this way, the conductive line 126 of the upper wiring structure 131 is electrically connected to the conductive line 122 of the lower wiring structure 130.

The prior-art method of fabricating a semiconductor device as shown in FIGS. 3A to 3D solves theoretically the above-described two problems. However, it does not always solve the problems in the actual fabrication processes. Specifically, in the etching process for forming the conductive line 122 and the SiO$_2$ protection layer 123 of the lower wiring structure 130, the structure 130 does not have the vertical side faces shown in FIG. 3A but the tilted side faces shown in FIG. 4A. In other words, the structure 130 has a tapered cross section, not a straight cross section. (To facilitate understanding, the tapered shape is illustrated in FIG. 4A exaggeratingly.)

When the SiON layer 124 covering the whole substrate 121 is etched back, the layer 124 is subjected to the etching action of the active species 132, as shown in FIG. 4B. Thus, the sidewalls 124a and 124b with a extremely small thickness are formed, as shown in FIG. 4C. (To facilitate understanding, the small thickness of the sidewalls 124a and 124b are illustrated in FIG. 4C exaggeratingly.) Since these thin sidewalls 124a and 124b do not provide the desired protection action, there is a high possibility that the undesired state shown in FIG. 2 occurs in the state of FIG. 3C.

Moreover, in recent years, to planarize the surface of an interlayer dielectric layer, the Chemical Mechanical Polishing (CMP) technique has been developed and used in practice. This is because the CMP technique has an advantage that efficient surface planarization of an interlayer dielectric layer is ensured. The CMP technique is a technique that uses a proper polishing apparatus, in which a rotating polishing pad is contacted with a desired interlayer dielectric layer on the rotating semiconductor wafer under pressure while a polishing slurry is supplied to the pad.

With the CMF technique, however, the polishing rate stability is not sufficiently high and thus, there is a problem that the polishing period must be adjusted according to the state of the polishing apparatus in order to provide a desired thickness of the interlayer dielectric layer. Also, there is another problem that the polishing rate fluctuates within the surface of the substrate according to the state of the wiring structure and/or the polishing apparatus.

As a consequence, generally, it is extremely difficult to realize a desired thickness of an interlayer dielectric layer by using the CMP technique, which means that the thickness of an interlayer dielectric layer needs to be controlled by a proper measure during the CMP process. In particular, with the recent, highly-integrated LSIs, precise thickness control of an interlayer dielectric layer is essential for the CMP process for planarizing its surface, because the thickness fluctuation of an interlayer dielectric layer affects the operation speed of the LSIs.

SUMMARY OF THE INVENTION

Accordingly, an object of the present invention is to provide a method of fabricating a semiconductor device that forms dielectric sidewalls reliably at each side of a stacked structure of a conductive line and a dielectric located on the line in order to protect the conductive line in the etching process for forming a via hole in an overlying interlayer dielectric layer.

Another object of the present invention is to provide a method of fabricating a semiconductor device that makes it possible to decrease significantly the thickness fluctuation of an overlying interlayer dielectric layer.

The above objects together with others not specifically mentioned will become clear to those skilled in the art from the following description.

A method of fabricating a semiconductor device according to the present invention comprises the steps of:

(a) forming a first dielectric layer over a semiconductor substrate;

(b) forming a first wiring structure on the first dielectric layer;

the first wiring structure comprising a conductive line and a dielectric formed on the line;

(c) forming a second dielectric layer on the first dielectric layer to cover the first wiring structure;

(d) forming a third dielectric layer serving as an interlayer dielectric layer on the second dielectric layer;

(e) polishing the third and second dielectric layers using the CMP technique until the dielectric of the first wiring structure is exposed, thereby aligning a surface of the third dielectric layer with a surface of the dielectric of the first wiring structure while part of the second dielectric layer that extends along each side of the first wiring structure and a surface of the first dielectric layer is selectively left;

(f) forming a mask with a pattern for a via hole on the remaining third dielectric layer after the step (e);

(g) selectively etching the dielectric of the first wiring structure using the mask, forming a via hole that reaches the conductive line of the first wiring structure;

(h) filling a conductive plug into the via hole after removing the mask; and (i) forming a second wiring structure on the remaining third dielectric layer or a fourth dielectric layer formed on the remaining third dielectric layer in such a way that the second wiring structure is electrically connected to the first wiring structure by way of the plug.

Furthermore, a polishing rate of the second dielectric layer in the step (e) is less than that of the third dielectric layer. An etching rate of the second dielectric layer in the step (g) is less than that of the dielectric of the first wiring structure.

With the method of fabricating a semiconductor device according to the present invention, the second dielectric layer is formed on the first dielectric layer to cover the first wiring structure and then, the third dielectric layer serving as the interlayer dielectric layer is formed on the second dielectric layer. Subsequently, the third and second dielectric layers are polished using the CMP technique until the dielectric of the first wiring structure is exposed, thereby aligning the surface of the third dielectric layer with the surface of the dielectric of the first wiring structure while the part of the second dielectric layer that extends along each side of the first wiring structure and a surface of the first dielectric layer is selectively left. Also, the etching rate of the second dielectric layer in the step (g) is less than that of the dielectric of the first wiring structure. As a result, the remaining part of the second dielectric layer that extends along each side of the first dielectric layer and the surface of the first dielectric layer can serve as protection sidewalls in the etching step (g) for forming the via hole.

Thus, the second dielectric layer is selectively left along each side of the first wiring structure by using the CMP technique instead of the etch back process causing the problems in the prior-art method. This makes sure that protective dielectric sidewalls are formed reliably at each side of the first wiring structure (i.e., the stacked structure of a conductive line and a dielectric located on the line) in the etching process for forming the via hole.

Moreover, the polishing rate of the second dielectric layer in the step (e) is less than that of the third dielectric layer and therefore, the endpoint of the polishing step (e) can be detected reliably by using the remaining second dielectric layer. This means that thickness fluctuation of the third dielectric layer serving as the interlayer dielectric layer can be significantly decreased.

Since the surface of the remaining part of the third dielectric layer is planarized after the polishing step (e), the thickness of the fourth dielectric layer located thereon is substantially uniform. Thus, the total thickness fluctuation of the remaining part of the third dielectric layer and the fourth dielectric layer can be significantly decreased.

In a preferred embodiment of the method according to the invention, the second wiring structure is formed directly on the remaining part of the third dielectric layer. The second wiring structure is electrically connected to the first wiring structure by way of the conductive plug.

In another preferred embodiment of the method according to the invention, the second wiring structure is formed over the remaining part of the third dielectric layer by way of the fourth dielectric layer. The via hole penetrates the third and fourth dielectric layers. The second wiring structure is electrically connected to the first wiring structure by way of the conductive plug.

In still another preferred embodiment of the method according to the invention, when the dielectric of the first wiring structure has a thickness of D, the thickness D is set to satisfy a specific condition. Specifically, when the third dielectric layer having an in-plane dimensional fluctuation and a polishing apparatus having an in-plane dimensional fluctuation provide a maximum, total in-plane dimensional fluctuation X, and the polishing rates of the second and third dielectric layers in the polishing apparatus are Y and Z, respectively, the thickness D satisfies an inequality of $$D > X \frac{Y}{Z}.$$

In this preferred embodiment, there is an additional advantage that the possibility that the conductive line of the first wiring structure is exposed to be polished before the polishing process is completed on the whole substrate can be eliminated reliably.

In a further preferred embodiment of the method according to the invention, the part of the third dielectric layer located over the first wiring structure is used to detect the endpoint of the polishing step (e) In this embodiment, there is an additional advantage that the process conditions can be set easily.

In a still further preferred embodiment of the method according to the invention, the dielectric of the first wiring structure and the third dielectric layer are made of oxide of silicon and the second dielectric layer is made of nitride of silicon. In this embodiment, there is an additional advantage that the advantages of the invention are exhibited effectively.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
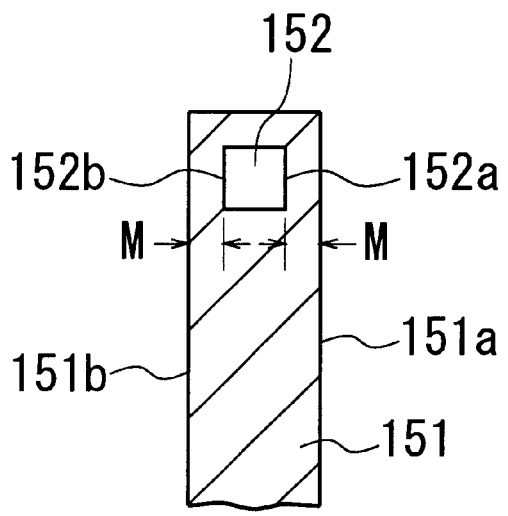
FIG. 1 is a schematic view showing the relationship between the layout and margin of a via hole to be overlapped with a conductive line.

Preferred embodiments of the present invention will be described in detail below while referring to the drawings attached.

First Embodiment

A method of fabricating a semiconductor device according to a first embodiment of the present invention is shown in FIGS. 7A to 7F.

Figure 7A:
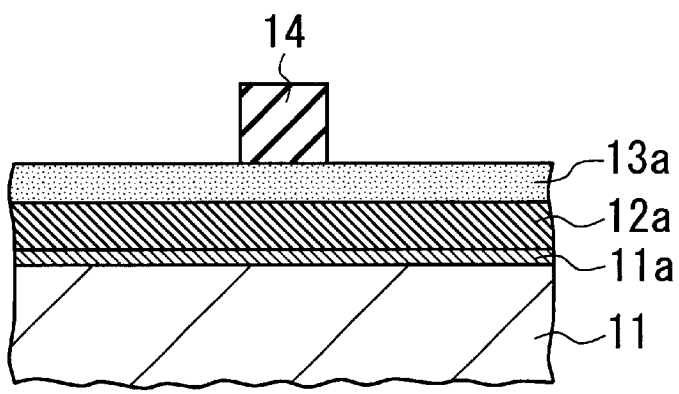
FIGS. 7A to 7F are schematic cross-sectional views showing the process steps of a method of fabricating a semiconductor device according to a first embodiment of the invention, respectively.
Figure 7B:
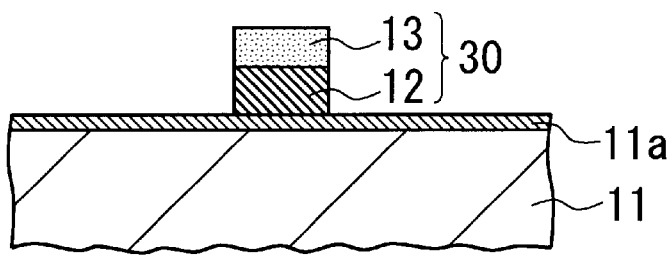

First, as shown in FIG. 7A, a single-crystal silicon substrate 11 containing specific electronic elements such as transistors therein is provided. The surface of the substrate 11 is covered with a BPSG (BoroPhosphorSilicate Glass) layer 11a. Then, an aluminum (Al) layer 12a is formed on the BPSG layer 11a over the whole substrate 11. A $SiO_2$ layer 13a is formed on the Al layer 12a thus formed.

Any barrier layer and/or a glare-prevention layer may be provided between the BPSG layer 11a and the Al layer 12a and/or between the Al layer 12a and the $SiO_2$ layer 13a, according to the necessity.

Thereafter, a patterned photoresist film 14 by a popular photolithographic process is formed on the $SiO_2$ layer 13a. The state at this stage is shown in FIG. 7A.

Following this, using the patterned photoresist film 14 as a mask, the Al layer 12a and the $SiO_2$ layer 13a are simultaneously etched to have the same pattern. Needless to say, the Al layer 12a and the $SiO_2$ layer 13a may be successively etched in the separate processes using the film 14 as a common mask. Also, after the $SiO_2$ layer 13a may be etched using the film 14 as a mask, the film 14 may be removed and then, the Al layer 12a may be etched using the patterned $SiO_2$ layer 13a as a mask. When the patterned $SiO_2$ layer 13a is used as a mask, the thickness of the $SiO_2$ layer 13a needs to be slightly larger than a specific desired thickness. This is because the thickness of the $SiO_2$ layer 13a is decreased due to unwanted etching in the etching process of the Al layer 12a.

The patterned Al layer 12a constitutes a conductive line 12 on the BPSG layer 11a. The patterned $SiO_2$ layer 13a constitutes a protection layer 13 located on the conductive line 12. The stacked structure of the conductive line 12 and the protection layer 13 constitutes a lower or first wiring structure 30. The structure 30 extends perpendicular to the paper to keep the cross-section of FIG. 7B substantially unchanged.

Figure 7C:
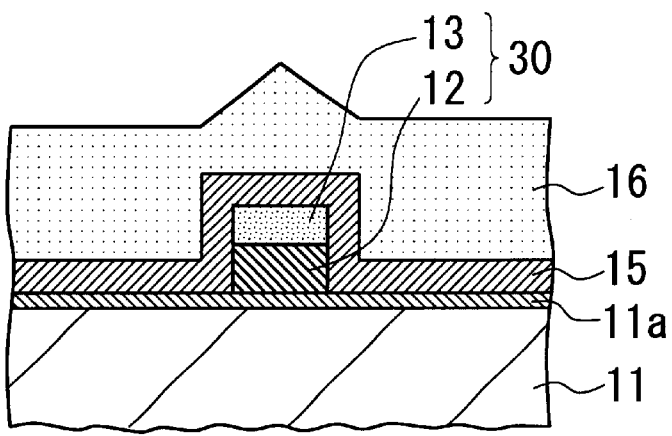

Subsequently, a silicon nitride ($Si_3 N_4$) layer 15 is formed on the BPSG sayer 11a over the whole substrate, thereby covering the lower or first wiring structure 30, as shown in FIG. 7C. The $Si_3 N_4$ layer 15 is used to form dielectric sidewalls at each side of the conductive line 12 of the structure 30. The $Si_3 N_4$ layer 15 has a protrusion corresponding to the protrusion of the structure 30. The thickness of the $Si_3 N_4$ layer 15 is set to be equal to or greater than the alignment accuracy or tolerance of a stepper to be used for the method according to the first embodiment. Here, the thickness of the $Si_3 N_4$ layer 15 is set at 200 nm.

A thick $SiO_2$ layer 16, which serves as an interlayer dielectric layer overlying the first wiring structure 30, is formed on the $Si_3 N_4$ layer 15 over the whole substrate 11. The $SiO_2$ layer 16 needs to have a sufficiently large thickness. Specifically, as shown in FIG. 7C, the thickness of the $SiO_2$ layer 16 is determined in such a way that the height of the surface of the $SiO_2$ layer 16 with respect to the surface of the BPSG layer 11a in the area other than the protruding part of the $Si_3 N_4$ layer 15 is greater than the height of the surface of the $Si_{3 N4}$ layer 15 at its protruding part. Thus, when the $SiO_2$ layer 16 is polished until the protection layer 13 of the first wiring structure 30 is exposed in a subsequent CMP process, the $SiO_2$ layer 16 can be reliably left on the $Si_3 N_4$ layer 15 in the area other than the protruding part of the $Si_3 N_4$ layer 15.

Figure 7D:
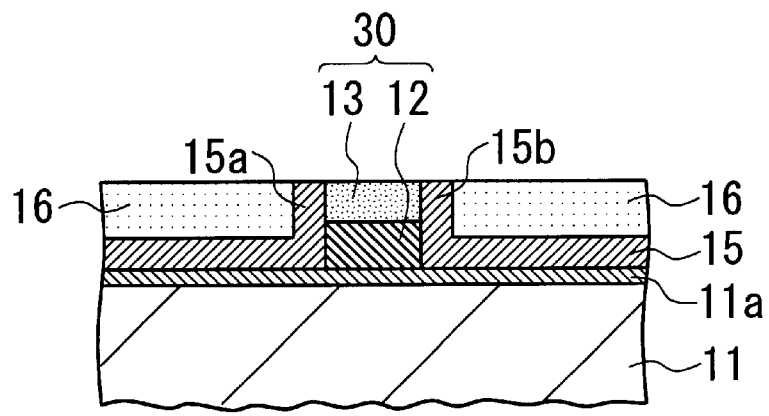

Furthermore, the $SiO_2$ layer 16 and the $Si_3 N_4$ layer 15 are polished by using the CMP technique. This polishing process is carried out under the condition that the polishing rate of the $Si_3 N_4$ layer 15 is less than that of the $SiO_2$ layer 16 until the protection layer 13 of the first wiring structure 30 is exposed. Thus, as shown in FIG. 7D, the part of the $Si_3 N_4$ layer 15 on the first wiring structure 30 is selectively removed. At the same time as this, the surface of the $SiO_2$ protection layer 13 of the structure 30, the surfaces of the exposed parts of the $Si_3 N_4$ layer 15 at each side of the structure 30, and the surface of the $SiO_2$ layer 16 are planarized so as to be involved in the same plane.

In the state shown in FIG. 7D, the remaining part of the $Si_3 N_4$ layer 15 extends along the both sides of the first wiring structure 30 to be perpendicular to the paper. Also, the remaining part of the $Si_3 N_4$ layer 15 extends horizontally along the surface of the BPSG layer 11a.

If a colloidal silica-system slurry for $SiO_2$ polishing on the market is used in the CM process, the polishing rate ratio (i.e., the ratio of the polishing rate of the $SiO_2$ layer 16 to the polishing rate of the $Si_3 N_4$ layer 15) can be set at approximately 5 easily. Thus, the $Si_3N_4$ layer 15 serves as a polishing stop in this process. Also, by setting the polishing rate ratio of ($SiO_2/Si_3 N_4$) at approximately 5, the post-polishing thickness fluctuation of the first wiring structure 30 can be decreased to approximately one-fifth (⅕) compared with the case where the polishing rate ratio is substantially equal to unity. Moreover, the $Si_3 N_4$ layer 15 can be selectively left at each side of the structure 30 reliably.

Figure 7E:
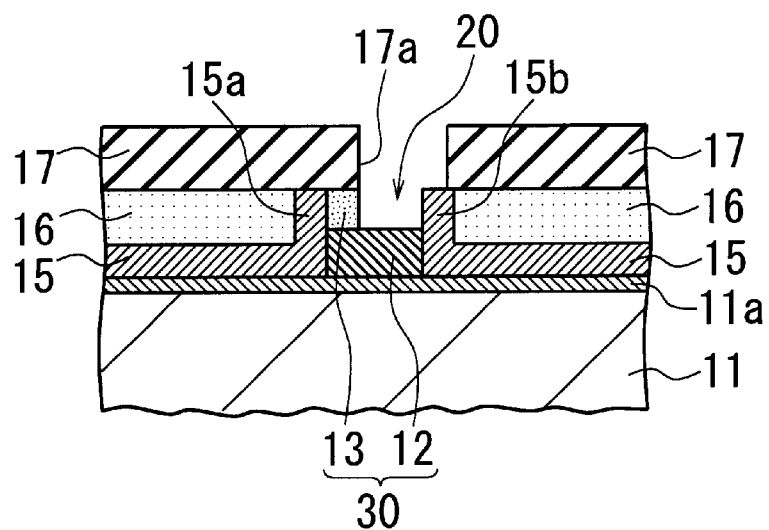

Following this, a patterned photoresist film 17 having a window 17a for forming a via hole is formed on the remaining $SiO_2$ layer 16 after the CMP process. Using the photoresist film 17 as a mask, the $SiO_2$ protection layer 13 of the first wiring structure 30 is selectively removed by a dry etching process, thereby forming a via hole 20 that penetrates the protection layer 13, as shown in FIG. 7E. The via hole 20 reaches the underlying conductive line 12 of the structure 30. This dry etching process is carried out under the condition that the etch rate of the $Si_3 N_4$ layer 15 is less than that of the $SiO_2$ protection layer 13 until the conductive line 12 of the structure 30 is exposed.

For example, if a popular $CHF_3$- or $CF_4$-system gas is used as the etching gas for $SiO_2$, the etch rate ratio (i.e., the ratio of the etch rate of the $SiO_2$ layer 16 to that of the $Si_3 N_4$ layer 15) can be set at 5 or higher.

When the window 17a of the photoresist film 17 is not correctly overlapped with the first wiring structure 30 due to accumulation of alignment or overlay errors in the practical process steps and as a result, the window 17a is shifted in the widthwise direction of the structure 30, as shown in FIG. 7E, the window 17a is overlapped with the remaining parts 15a and 15b of the $Si_3 N_4$ layer 15 that extend vertically along the side faces of the structure 30. In this case, however, the parts 15a and 15b of the $Si_3 N_4$ layer 15 serve as dielectric sidewalls for protecting the structure 30 against the etching action and thus, the underlying conductive line 12 of the structure and the BPSG layer 11a can be prevented from being etched. Thus, the via hole 20 can be formed in self-alignment to the line 12 in spite of positional deviation of the window 17a of the photoresist film 20.

Figure 7F:
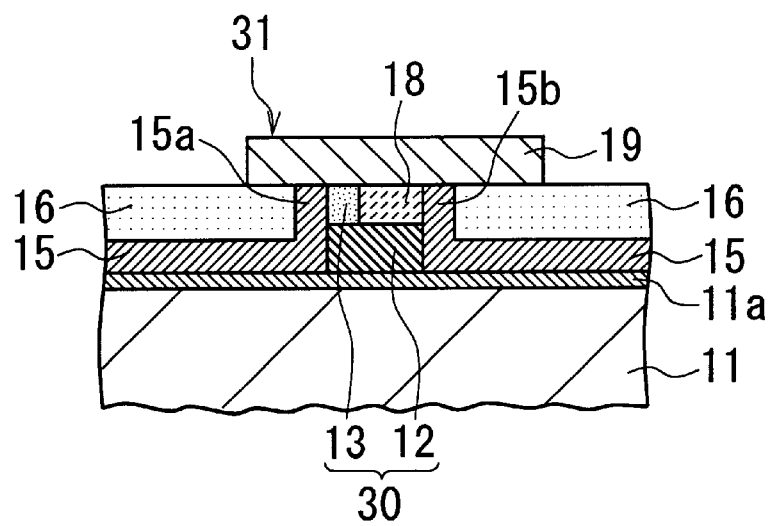

Subsequently, after the photoresist film 17 is removed, a W layer (not shown) is deposited on the $SiO_2$ layer by a popular process and then, the W layer is etched back, thereby selectively leaving the W layer in the via hole 20. The W layer thus left in the hole 20 serves as a W plug 18. The hole 20 is filled with the plug 18, as shown in FIG. 7F.

Moreover, an Al layer 19 is formed on the $SiO_2$ layer by a popular process and then, the Al layer 19 is patterned to have a specific shape in such a way that the bottom of the Al layer 19 is contacted with the top of the W plug 18. Thus, an upper or second wiring structure 31 is formed on the $SiO_2$ layer 16 by the remaining Al layer 19. The upper wiring structure 31 is electrically connected to the lower wiring structure 30 by way of the W plug 18.

The thickness D of the $SiO_2$ protection layer 13 of the lower wiring structure 30 is set to satisfy a specific condition. Specifically, it is supposed that the $SiO_2$ layer 16 having an in-plane dimensional fluctuation over the whole substrate 11 and the polishing apparatus having an in-plane dimensional fluctuation over the whole substrate 11 provide a maximum, total in-plane dimensional fluctuation X, and that the polishing rates of the $SiO_2$ layers 13 and 16 are Y and Z, respectively. In this case, the thickness D of the layer 13 needs to satisfy the inequality of $$D > X \frac{Y}{Z}.$$

If the thickness D does not satisfy the above inequality, there is a possibility that the conductive line 12 of the first wiring structure 30 is exposed in any of the chip sites provided on the whole substrate 11 before the polishing process of the $Si_3N_4$ layer 15 on the first wiring structure 30 is completed to expose the underlying $SiO_2$ protection layer 13 in all the chip sites. In this case, the conductive line 12 is polished to have a cross section smaller than a desired value. This is the same as the unwanted decrease in cross section of the conductive line 122 due to the etching action, which is not preferred. On the other hand, if the thickness D satisfies the above-identified inequality, the possibility that the conductive line 12 is exposed in any of the chip sites before the polishing process is completed in all the chip sites can be eliminated reliably.

For example, if X=200 nm, Y=40 nm, and Z=200 nm, the above-identified inequality is expressed as D>40 nm. In the method according to the first embodiment, for example, the thickness D may be set as D=500 nm with a proper margin under consideration of D>40 nm.

Additionally, in the method according to the first embodiment, the second or upper wiring structure 31 is electrically connected to the first or lower wiring structure 30 formed on the Si substrate 11. However, the present invention is not limited to this case. For example, it is needless to say that the upper wiring structure 31 may be electrically connected to a conductive region or member, such as a diffusion region formed in the surface region of the substrate 11 or an electrode formed over the substrate.

With the method of fabricating a semiconductor device according to the first embodiment, as explained above, the $Si_3N_4$ layer 15 is formed on the BPSG layer 11a to cover the first wiring structure 30 and then, the thick $SiO_2$ layer 16 serving as the interlayer dielectric layer is formed on the $Si_3N_4$ layer 15. Subsequently, the $SiO_2$ and $Si_3N_4$ layers 16 and 15 are polished using the CMP technique until the $SiO_2$ protection layer 13 of the wiring structure 30 is exposed. Thus, the surface of the $SiO_2$ layer 16 is aligned with the surface of the $SiO_2$ protection layer 13 of the structure 30 and at the same time, the part of the $Si_3N_4$ layer 15 that extends along each side of the structure 30 and the surface of the BPSG layer 11a is selectively left. Also, the etching rate of the $Si_3N_4$ layer 15 is less than that of the $SiO_2$ protection layer 13 of the structure 30 in the etching process for forming the via hole 20. As a result, the part of the $Si_3N_4$ layer 15 that extends along each side of the structure 30 and the surface of the BPSG layer 11a serves as the dielectric protection sidewalls in the same etching process.

Accordingly, the $Si_3N_4$ layer 15 is selectively left along each side of the first wiring structure 30 by using the CMP technique instead of the etch back process causing the problems in the prior-art method. This makes sure that protective dielectric sidewalls are formed reliably at each side of the structure 30 in the etching process for forming the via hole 20.

Moreover, the polishing rate of the $Si_3N_4$ layer 15 is less than that of the $SiO_2$ layer 16 in the CMP process and therefore, the endpoint of the CMP process can be detected reliably using the $Si_3N_4$ layer 15. This means that thickness fluctuation of the $SiO_2$ layer 16 serving as the interlayer dielectric layer can be significantly decreased.

Figure 5:
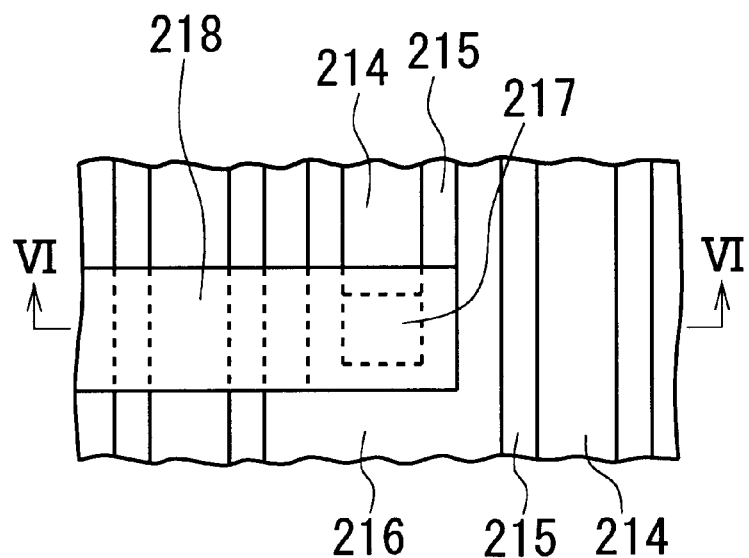
FIG. 5 is a schematic, partial an view showing the configuration of a prior-art semiconductor device.
Figure 6:
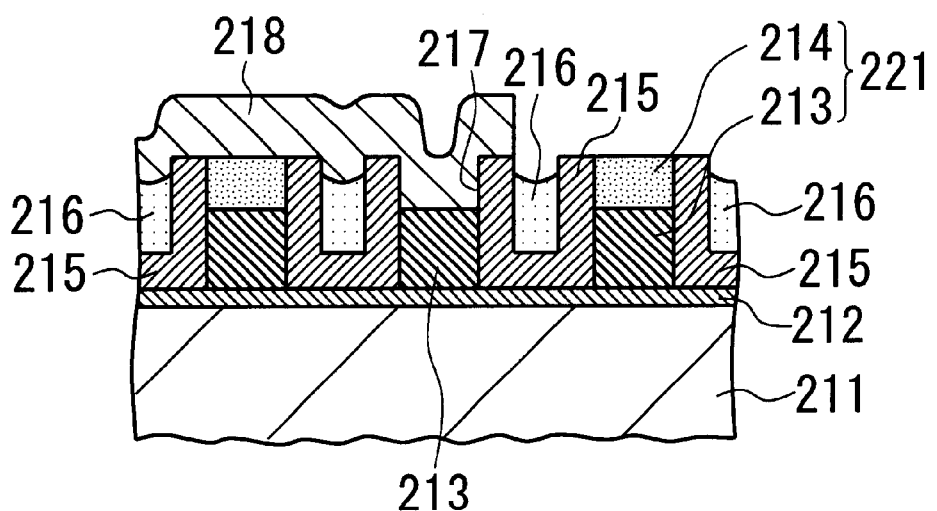
FIG. 6 is a schematic cross-sectional view along the line VI—VI in FIG. 5.

Additionally, the Japanese Non-Examined Patent Publication No. 4-74430 published in March 1952 discloses a prior-art semiconductor device, which is shown in FIGS. 5 and 6. This device has a similar structure to the resultant semiconductor device fabricated by the method according to the first embodiment.

As shown in FIGS. 5 and 6, with the prior-art semiconductor device, a pad oxide layer 212 is formed on the surface of a silicon substrate 211. A lower wiring structure 221, which comprises a patterned first conductive layer 213 and a patterned first dielectric layer 214 located on the conductive layer 213, is formed on the pad oxide layer 212. Sidewalls having a U-shaped cross section, which are formed by a patterned second dielectric layer 215, are arranged between the adjoining conductive lines of the conductive layer 213. To planarize the surface of the second dielectric layer 215, a polyimide resin 216 is filled into the trenches between the sidewalls. An upper wiring structure 218 is formed on the first dielectric layer 214, the second dielectric layer 215, and the polyimide resin 216.

Contact holes 217 are formed by selectively removing the corresponding parts of the first dielectric layer 214 forming the lower wiring structure 221. The upper wiring structure 218 is contacted with the first conductive layer 213 of the lower wiring structure 221 by way of the holes 217.

The publication No. 4-74430 further discloses the structure that the second dielectric layer 215 is made of a polyimide resin and the polyimide resin itself is used as the dielectric sidewalls.

With the prior-art semiconductor device shown in FIGS. 5 and 6, the contact holes 217 are formed by selectively removing the corresponding parts of the first dielectric layer 214 by a wet etching process using a buffered hydrofluoric acid (HF) as an etchant and a patterned resist film as a mask. If the first dielectric layer 214 is made of $SiO_2$ and the second dielectric layer (i.e., sidewalls) 215 is made of $SiN_x$, the layer 215 is not etched in this wet etching process and therefore, the contact holes 217 can be formed to have approximately the same width as a corresponding line of the first conductive layer 213. In other words, the width of the corresponding lines of the first conductive layer 213 to the holes 217 need not be increased.

Figure 2:
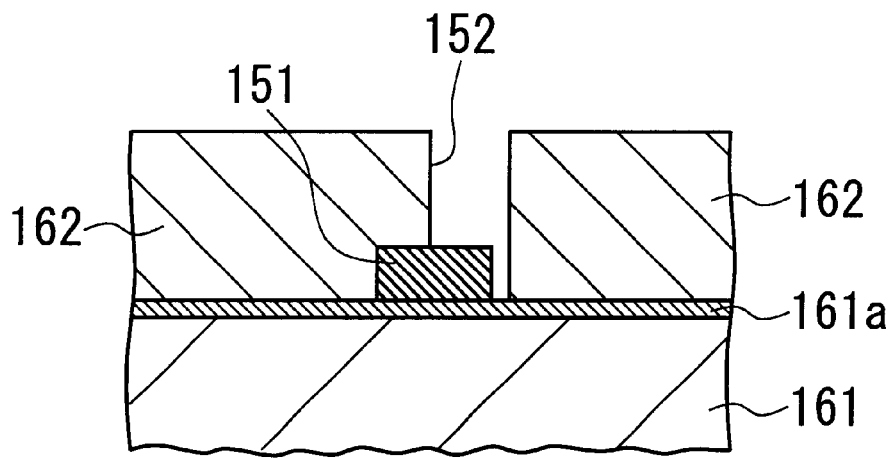
FIG. 2 is a schematic cross-sectional view showing the problem occurring in the layout shown in FIG. 1.
Figure 3A:
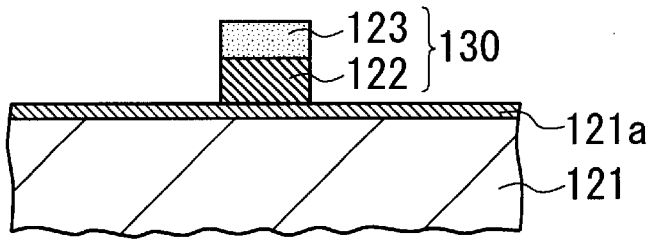
FIGS. 3A to 3D are schematic cross-sectional views showing the process steps of a prior-art method of fabricating a semiconductor device, respectively.
Figure 3B:
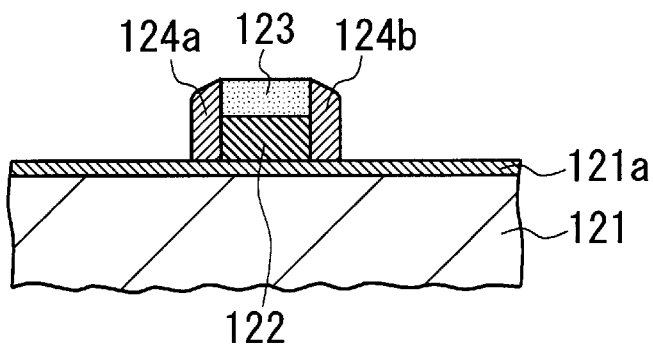
Figure 3C:
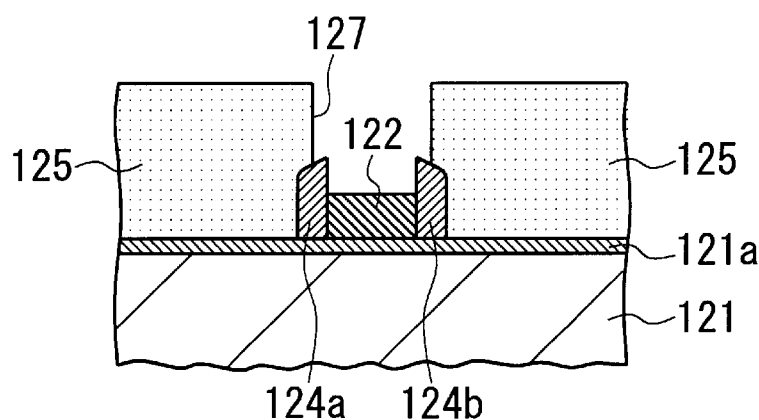
Figure 3D:
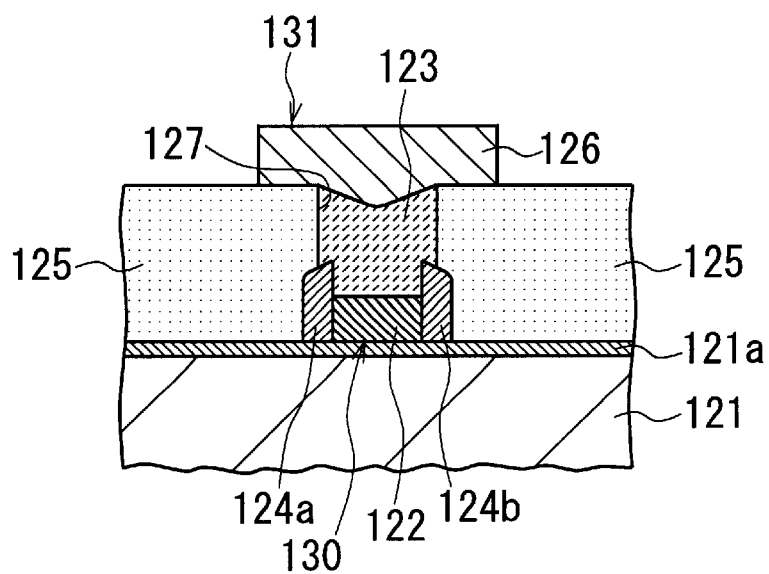
Figure 4A:
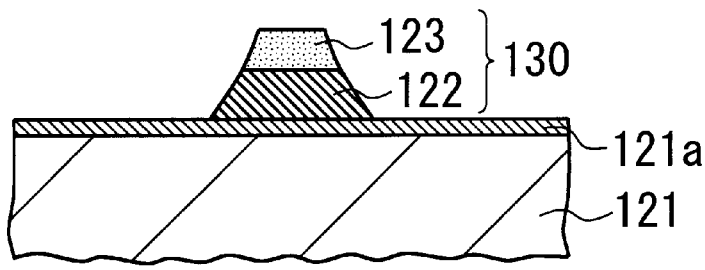
FIGS. 4A to 4C are schematic cross-sectional views showing the problem occurring in the prior-art method shown in FIGS. 3A to 3D, respectively.
Figure 4B:
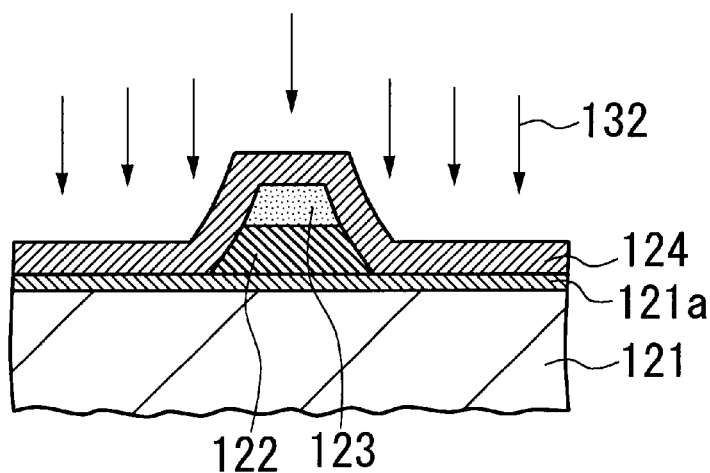
Figure 4C:
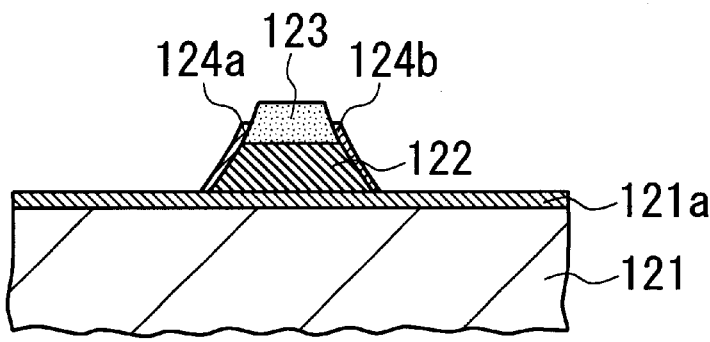

However, with the prior-art semiconductor device shown in FIGS. 5 and 6, no concrete method is disclosed to form the dielectric sidewalls by the dielectric layer 215 and this the same problem as explained previously with reference to FIG. 2 tends to occur. Also, the interlayer dielectric layer covering the lower wiring structure 221 is not referred of explained. As a result, it is clear that the problem of the present invention to precisely control the thickness of the interlayer dielectric layer is unable to be solved. This means that the prior-art semiconductor device shown in FIGS. 5 and 6 and the method of fabrication the same are quite different from the method of the invention.

Second Embodiment

FIG. 8A to 8F show a method of fabricating a semiconductor device according to a second embodiment of the invention.

In the above-explained method according to the first embodiment, as shown in FIG. 7E, the patterned photoresist film 17 is directly formed on the $SiO_2$ layer 16 after the CMP process is completed. Then, the via hole 20 is formed by the etching process using the film 17 as a mask. Thus, only the remaining $SiO_2$ layer 16 after the CMP process serves as the interlayer dielectric layer overlying the first wiring structure 30. In this case, however, the thickness of the interlayer dielectric layer 16 may be insufficient for a specific purpose. The method of the second embodiment is preferably applied to this case.

The process steps shown in FIGS. 8A to 8D are the same as those shown in FIGS. 7A to 7D, respectively. Thus, the explanation about these process steps are omitted here for the sake of simplification of description by attaching the same reference symbols as used the first embodiment to the same or corresponding elements in FIGS. 8A to 8D.

Figure 8A:
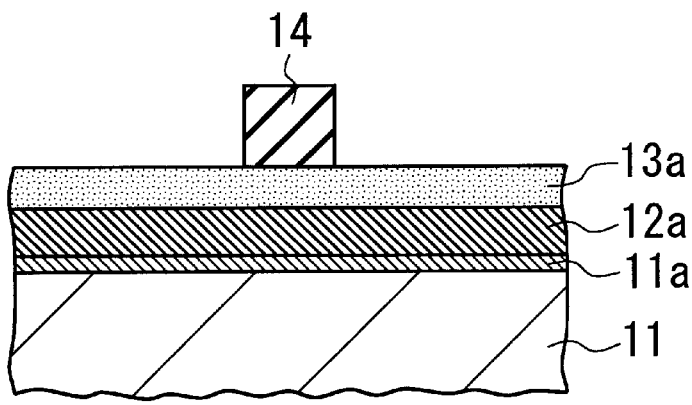
FIGS. 8A to 8F are schematic cross-sectional views showing the process steps of a method of fabricating a semiconductor device according to a second embodiment of the invention, respectively.
Figure 8B:
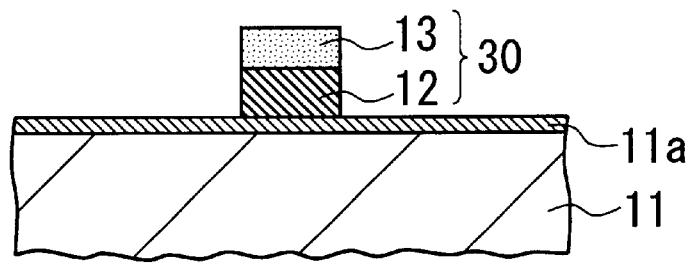
Figure 8C:
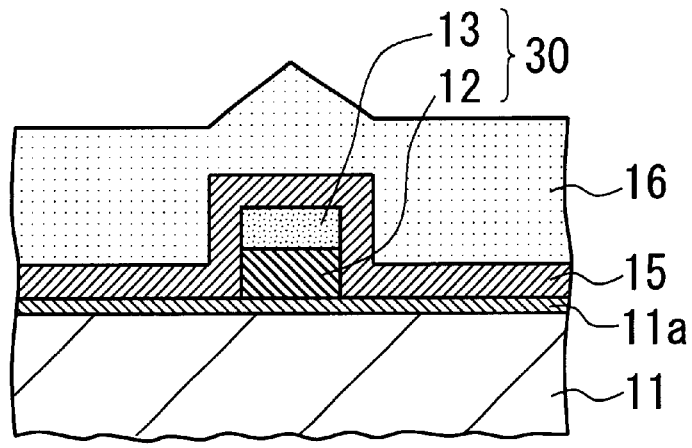
Figure 8D:
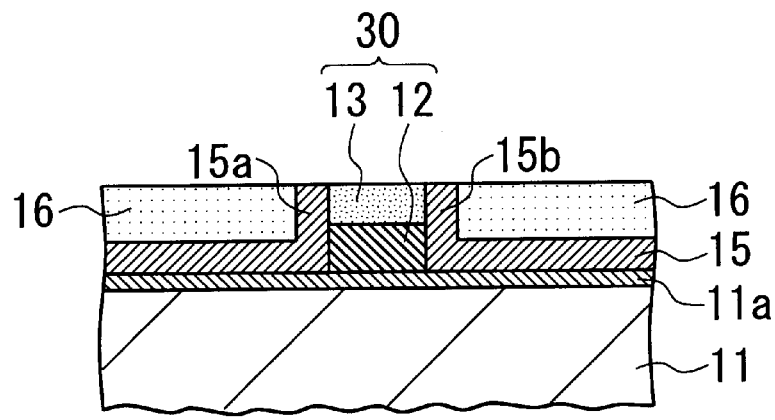
Figure 8E:
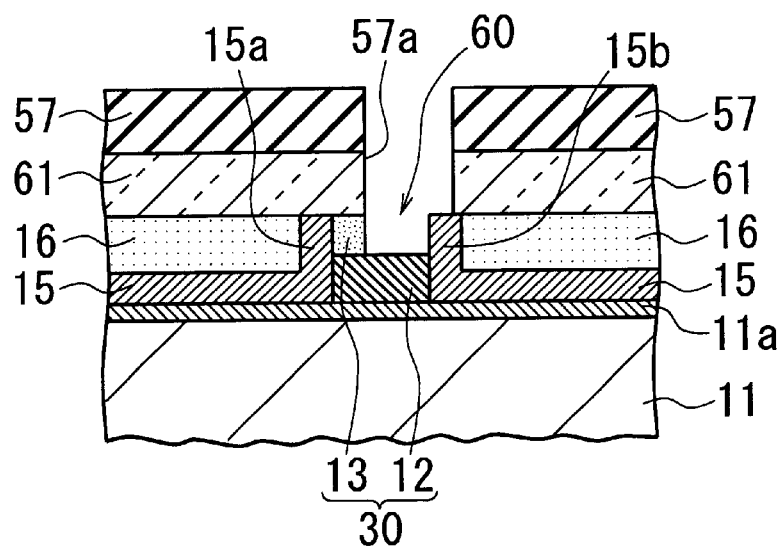

In the method according to the second embodiment, as shown in FIG. 8E, a $SiO_2$ layer 61 serving as an interlayer dielectric layer is formed on the $SiO_2$ layer 16 after the CMP process is completed. Then, a patterned photoresist film 57 with a window 57a is formed on the $SiO_2$ layer 61. Using the photoresist film 57 as a mask, the $SiO_2$ layer 61 and the $SiO_2$ protection layer 13 of the first wiring structure 30 are selectively etched, thereby forming a via hole 60 that penetrate the $SiO_2$ layers 61 and 13. The hole 60 reaches the underlying conductive line 12 of the structure 30 by way of the $SiO_2$ layers 61 and 13.

Figure 8F:
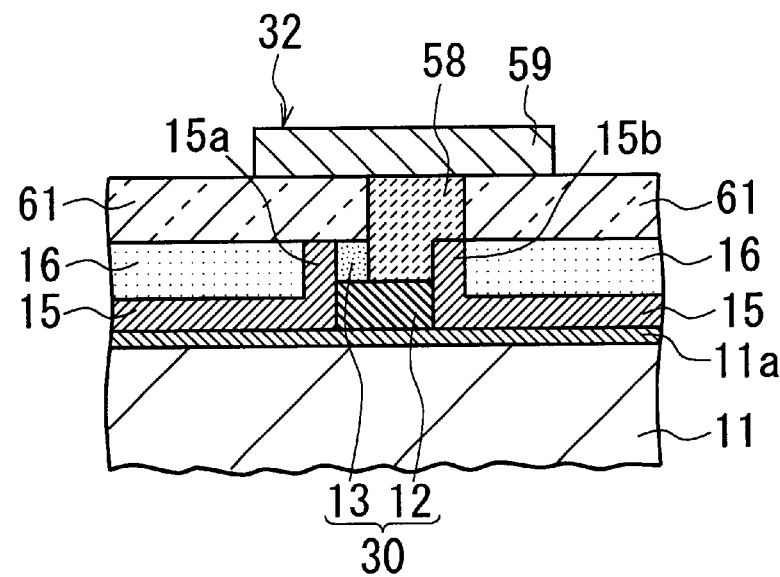

After the via hole 60 is formed, in the same way as the first embodiment, as shown in FIG. 8F, a W plug 58 is filled into the hole 60 and a patterned Al layer 59 is formed on the $SiO_2$ layer 61. The bottom of the Al layer 61 is contacted with the top of the W plug 58. Thus, an upper wiring structure 32 comprising the patterned Al layer 59 is formed on the $SiO_2$ layer 61. The upper wiring structure 32 is electrically connected to the lower wiring structure 30 by way of the W plug 58.

As explained above, with the method according to the second embodiment, similar to the method of the first embodiment, the dielectric sidewalls for protecting the conductive line 12 of the first or lower wiring structure 30 can be formed reliably in the etching process for forming the via hole 60. Also, since the surface of the remaining part of the SiO$_2$ layer 16 is planarized, the thickness of the SiO$_2$ layer 61 located thereon is substantially uniform. Thus, the total thickness fluctuation of the remaining parts of the SiO$_2$ layers 16 and 61 which serve as the interlayer dielectric layer, can be significantly decreased.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of fabricating a semiconductor device, comprising the steps of:

(a) forming a first dielectric layer over a semiconductor substrate;

(b) forming a first wiring structure on said first dielectric layer; said first wiring structure comprising a conductive line and a dielectric formed on said conductive line;

(c) layer forming a second dielectric layer on said first dielectric to cover said first wiring structure;

(d) forming a third dielectric layer serving as an interlayer dielectric layer on said second dielectric layer;

(e) polishing said third and second dielectric layers using a CMP technique until said dielectric of said first wiring structure is exposed, thereby aligning a surface of said third dielectric layer with a surface of said dielectric of said first wiring structure while part of said second dielectric layer that extends along each side of said first wiring structure and a surface of said first dielectric layer is selectively left;

(f) forming a mask with a pattern for a via hole on a remaining third dielectric layer after the step (e);

(g) selectively etching said dielectric of said first wiring structure using said mask, forming a via hole that reaches said conductive line of said first wiring structure;

(h) filling a conductive plug into said via hole after removing said mask; and (i) forming a second wiring structure on said remaining third dielectric layer or a fourth dielectric layer formed on said remaining third dielectric layer in such a way that said second wiring structure is electrically connected to said first wiring structure by way of said conductive plug;

wherein a polishing rate of said second dielectric layer in the step (e) is less than that of said third dielectric layer, and an etching rate of said second dielectric layer in the step (g) is less than that of said dielectric of said first wiring structure.

2. The method according to claim 1, wherein said second wiring structure is formed directly on said remaining third dielectric layer;

and wherein said second wiring structure is electrically connected to said first wiring structure by way of said conductive plug.

3. The method according to claim 1, wherein said second wiring structure is formed over said remaining third dielectric layer by way of said fourth dielectric layer;

and wherein said via hole penetrates said third and fourth dielectric layers;

and wherein said second wiring structure is electrically connected to said first wiring structure by way of said conductive plug.

4. The method according to claim 1, wherein when said dielectric of said first wiring structure has a thickness of D, the thickness D is set to satisfy an inequality of $$D > X\frac{Y}{Z},$$

where said third dielectric layer having an in-plane dimensional fluctuation and a polishing apparatus having an in-plane dimensional fluctuation provide a maximum, total in-plane dimensional fluctuation X, and the polishing rates of said second and third dielectric layers in said polishing apparatus are Y and Z, respectively.

5. The method according to claim 1, wherein said remaining third dielectric layer located over said first wiring structure is used to detect an endpoint of the step (e) of polishing said second and third dielectric layers.

6. The method according to claim 1, wherein said dielectric of said first wiring structure and said third dielectric layer are made of oxide of silicon:

and wherein said second dielectric layer is made of nitride of silicon.

* * * * *